(12) United States Patent
Yamanaka

(10) Patent No.: US 7,622,959 B2
(45) Date of Patent: Nov. 24, 2009

(54) PHASE COMPARATOR AND SEMICONDUCTOR DEVICE WITH PHASE COMPARATOR

(75) Inventor: Hiroaki Yamanaka, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/076,052

(22) Filed: Mar. 10, 2005

(65) Prior Publication Data
US 2006/0097755 A1 May 11, 2006

(30) Foreign Application Priority Data
Nov. 8, 2004 (JP) ............................. 2004-323766

(51) Int. Cl.
*H03D 13/00* (2006.01)
(52) U.S. Cl. ............................................. 327/3; 327/12
(58) Field of Classification Search ................ 327/3, 327/12
See application file for complete search history.

(56) References Cited

U.S. PATENT DOCUMENTS 6,259,754 B1 * 7/2001 Jeong .......................... 375/375

FOREIGN PATENT DOCUMENTS

| JP | 03-101517 | 4/1991 |
|---|---|---|
| JP | 04-241520 | 8/1992 |
| JP | 2001-007699 | 1/2001 |

OTHER PUBLICATIONS

Ken Bigelow, Deriving the XOR function, http://www.play-hookey.com/digital/xor_function.html, copyright 1996.*

* cited by examiner

*Primary Examiner*—Lincoln Donovan
*Assistant Examiner*—Khareem E. Almo
(74) *Attorney, Agent, or Firm*—Arent Fox LLP

(57) ABSTRACT

It is an object of the present invention to improve the phase difference detection accuracy of a phase comparator. A phase difference signal generation circuit outputs a signal C_SIGNAL which takes a high level for a period corresponding to the phase difference between the comparison target signals COMP1 and COMP2 to the control terminal of a tri-state buffer, based on a signal synchronous with the start-up of the comparison target signal COMP1 detected by an edge detection flag generation circuit and a signal synchronous with the start-up of the comparison target signal COMP2 detected by an edge detection flag generation circuit. A status management circuit outputs a signal A_SIGNAL corresponding to the phase advance or delay of the comparison target signals COMP1 and COMP2 to the input terminal of the tri-state buffer.

25 Claims, 13 Drawing Sheets

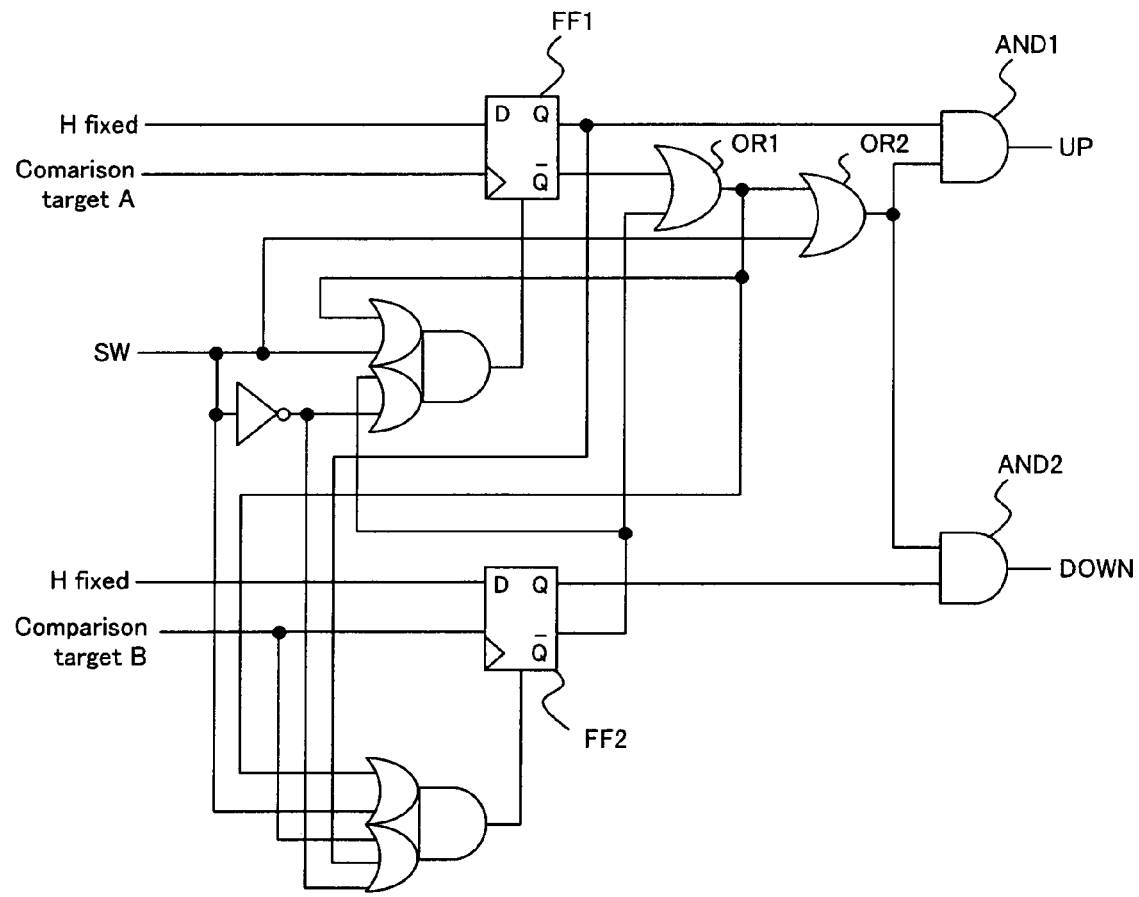
F I G. 1

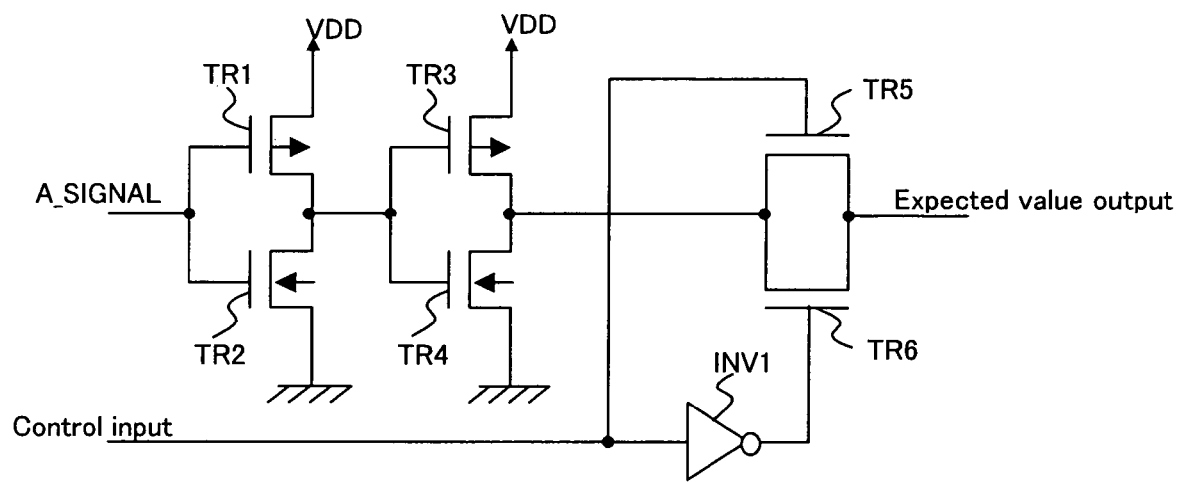
F I G. 5

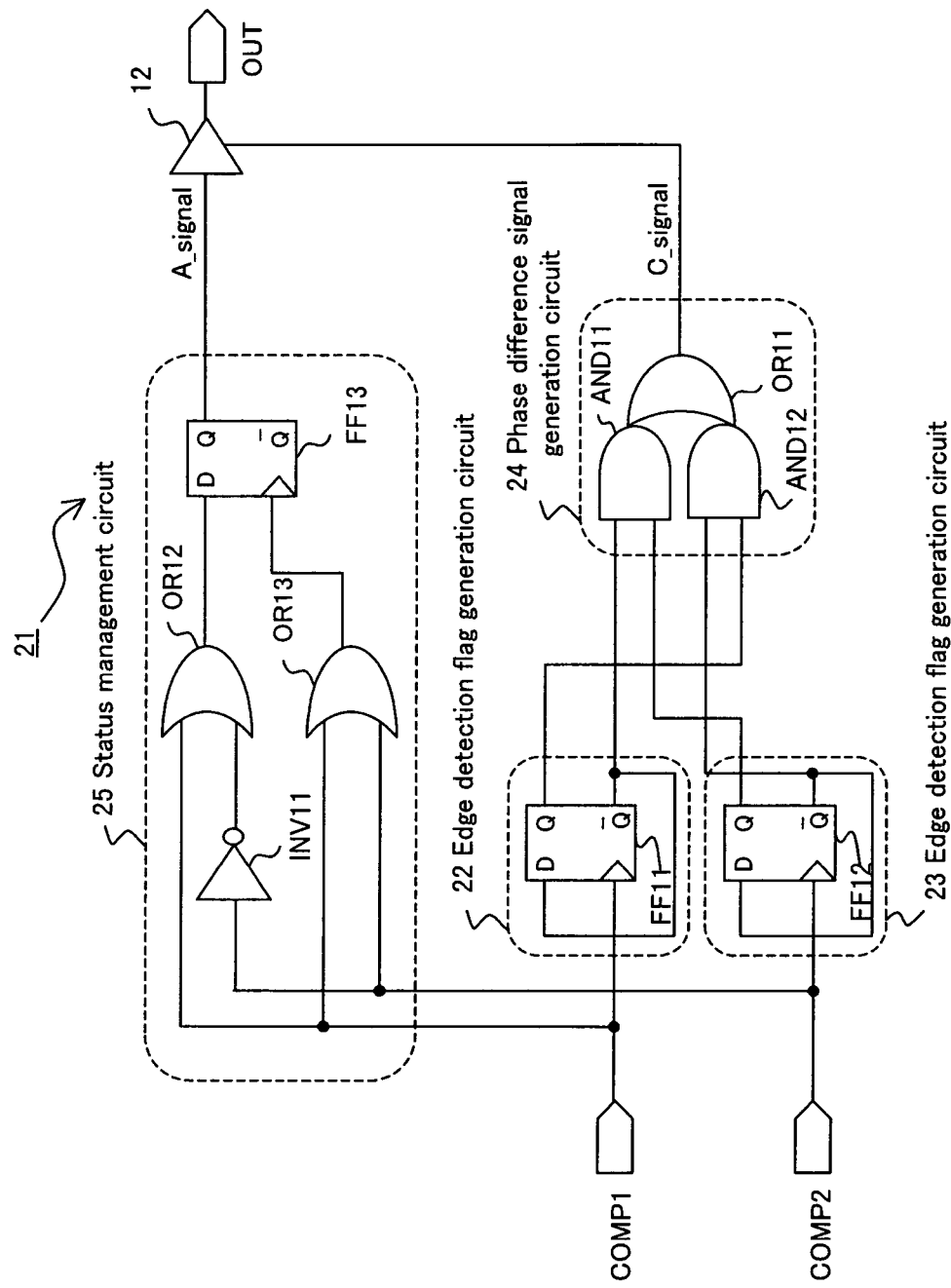
F I G. 7

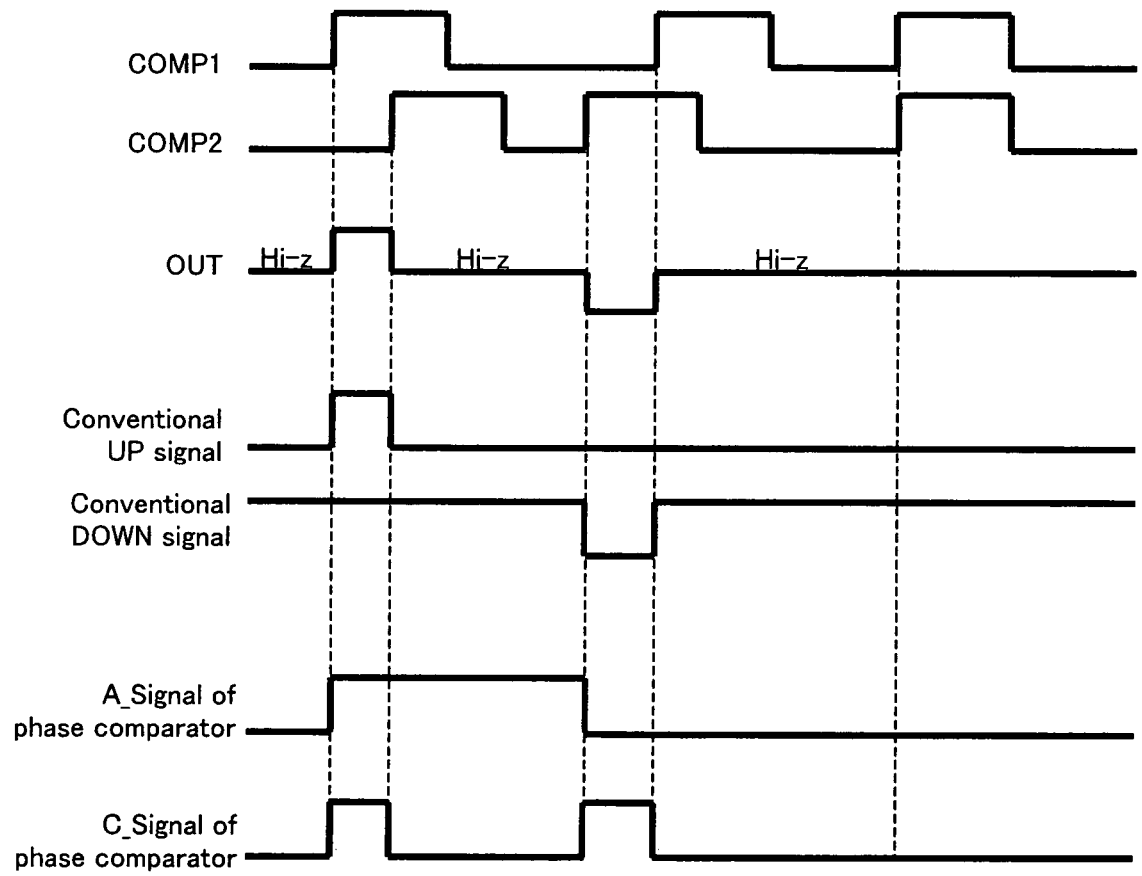
F I G. 8

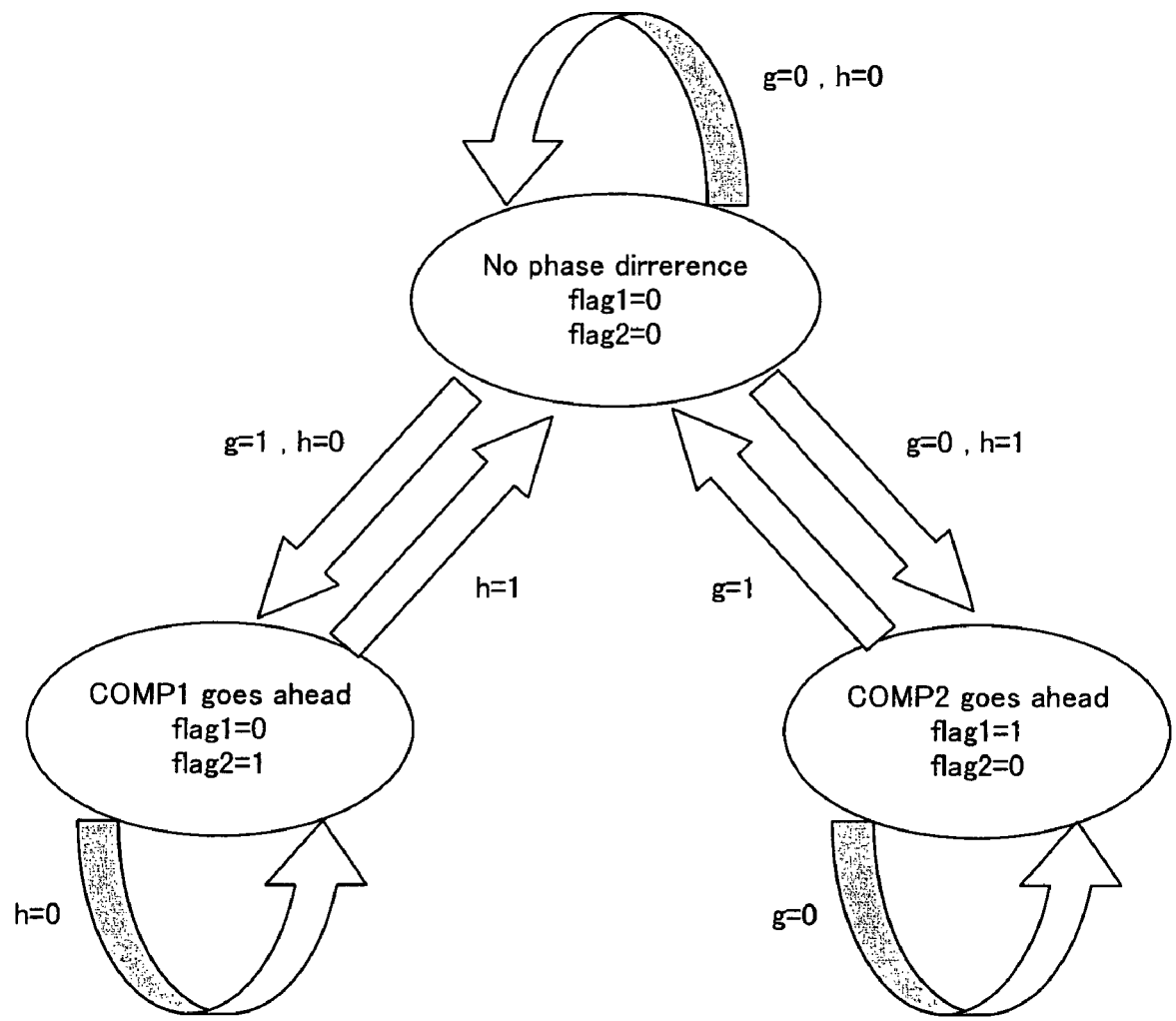
F I G. 13

PHASE COMPARATOR AND SEMICONDUCTOR DEVICE WITH PHASE COMPARATOR

CROSS-REFERENCE TO RELATED APPLICATIONS

This application is based upon and claiming the benefit of priority from the prior Japanese Patent Application No. 2004-323766, filed in Nov. 8, 2004, the entire contents of which are incorporated herein by reference.

BACKGROUND OF THE INVENTION

1. Field of the Invention

The present invention relates to a phase comparator and a semiconductor device with the phase comparator.

2. Description of the Related Art

A phase locked loop (PLL) circuit comprises a phase comparator for detecting the phase difference between a reference frequency signal and a control target signal, a charge pump whose transistors connected in series are switched on/off by an UP/DOWN signals, respectively, outputted from the phase comparator, a low-pass filter and the like.

Patent Reference 1 discloses that a PLL circuit comprises a pulse width detection circuit for detecting the output pulse width of the frequency phase comparator and the driving capability of a charge pump is increased by connecting two of a p-channel MOS transistor and a n-channel MOS transistor of a charge pump in parallel.

Patent Reference 2 can be obtained by improving Patent Reference 1, and controls its output current characteristic by its phase error signal.

Patent Reference 3 discloses one phase comparator instead of two phase comparators, which can detects the phase difference between two comparison input signals and the output signal by providing a circuit for switching the two comparison input signals.

FIG. 1 shows the simplified circuit diagram of the phase comparator of Patent Reference 3. The circuit of this phase comparator, which generates UP/DOWN signals, is described below.

Comparison target signals A and B are inputted to the clock terminals of type D flip-flops FF1 and FF2, respectively.

The inverted output Q of the type D flip-flop FF1 to which the comparison target signal B is inputted as a clock signal (hereinafter called "output Q bar") and the output Q bar of the type D flip-flop FF2 are inputted to an OR gate OR1 and its output is inputted to an OR gate OR2. Then, the output of the OR gate OR2 and the output Q of the type D flip-flop FF1 are inputted to an AND gate AND1. The output signal of this AND gate AND1 is outputted as an UP signal for switching a transistor on the power supply side of the charge pump.

The output Q of the type D flip-flop FF2 to which the comparison target signal B is inputted as a clock signal is inputted to an AND gate AND2 and the output signal of the OR gate OR2 is inputted to the other input terminal of the AMD gate AND2. The output signal of this AND gate AND2 is outputted as a DOWN signal for a transistor on the ground side of the charge pump.

If an asynchronous phase comparator for outputting UP/DOWN signals as shown in FIG. 1 is formed on a semiconductor integrated circuit, there is a possibility that an UP/DOWN signal delays due to the wiring length of a logic circuit constituting the phase comparator, a signal that simultaneously switches the two transistors of the charge pump on is outputted, and current flows through the two transistors. If current flows, the leak current of the semiconductor integrated circuit increases.

In the phase comparator shown in FIG. 1, since the comparator target signal A is outputted as an UP signal through the type D flip-flop FF1, two OR gates OR1 and OR2 and an AND gate AND1, and there are many stages of logic circuits, its delay time increases. If the delay time increases in the phase comparator, the detection accuracy of the phase difference degrades and the lock time of the PLL circuit becomes long.

Patent Reference 1: Japanese Patent Application No. H4-241520

Patent Reference 2: Japanese Patent Application No. 2001-7699

Patent Reference 3: Japanese Patent Application No. H3-101517

SUMMARY OF THE INVENTION

It is an object of the present invention to improve the phase difference detection accuracy of a phase comparator. It is another object of the present invention to reduce the through current of a charge pump on the output side.

The phase comparator of the present invention comprises a first edge detection circuit for detecting a first comparison target signal, a second edge detection circuit for a second comparison target signal, a phase difference signal generation circuit for outputting signals corresponding to the phase differences of the first and second comparison target signals to the control terminal of a tri-state circuit, based on the detection signals of the first and second edge detection circuits and a status management circuit for outputting signals corresponding to a phase advance or delay between the first and second comparison target signals to the input terminal of the tri-state circuit.

According to the present invention, by simplifying the circuit of the phase comparator, the delay of a signal in the circuit can be reduced, and the phase difference detection accuracy of the comparison target signals can be improved.

By using a tri-state circuit on the output side, through current can be reduced and the leak current of the circuit can be reduced.

In another aspect of the phase comparator, the first and second edge detection circuits comprises a holding circuit for holding its own inverted output signal in a timing synchronous with the start-UP of the first comparison target signal. For example, the holding circuit corresponds to a type D flip-flop FF11 shown in FIG. 6.

By adopting such a configuration, a signal synchronous with the start-UP edge of a comparison target signal can be generated.

The status management circuit outputs signals corresponding to the advance or delay of the first and second comparison target signals to the input terminal of the tri-state circuit.

By adopting such a configuration, for example, a signal indicating that the phase of the first comparison target signal goes ahead of or behind the phase of the second comparison target signal can be outputted.

In another aspect of the phase comparator, the status management circuit comprises a first OR circuit for carrying out logical OR between a signal obtained by inverting the second comparator target signal and the first comparator target signal, a second OR circuit carrying out logical OR between the first comparison target signal and the second comparison target signal and a holding circuit for holding the output signal of the first OR circuit in a timing synchronous with the output signal of the second OR circuit.

By adopting such a configuration, the status management circuit can be simply configured.

In another aspect of the phase comparator, the phase difference signal generation circuit outputs a signal whose status changes in synchronization with the respective start-UP of the detection signals of the first and second edge detection circuits.

By adopting such a configuration, a signal corresponding to the phase difference between the first and second comparison target signals can be generated.

In another aspect of the phase comparator, the status management circuit comprises a first AND circuit carrying out logical AND between the inverted detection signal of the first edge detection circuit and the detection signal of the second edge detection circuit, a second AND circuit for carrying out the detection signal of the first edge detection circuit and the inverted detection signal of the second edge detection circuit and an OR circuit for carrying out logical OR between the respective output signals of the first and second AND circuits.

By adopting such a configuration, a signal corresponding to the phase difference between the first and second comparison target signals can be generated.

Another aspect of the phase comparator comprises a first edge detection circuit for detecting a first comparison target signal in a timing synchronous with a clock signal, a second edge detection circuit for detecting a second comparator target signal in a timing synchronous with a clock signal, a state output circuit for outputting a signal corresponding to the phase difference between the first and second comparison target signals to the control terminal of a tri-state circuit, based on the first and second edge detection circuits and a status management circuit for outputting signals corresponding to the advance or delay of the phases of the first and second comparison target signals to the input terminal of the tri-state circuit.

According to the present invention, in simultaneous designing of the phase comparator, the circuit of the phase comparator can be simplified, the delay of a signal in the circuit can be reduced and the phase difference detection accuracy of the comparison target signals can be improved. By using the tri-state circuit on the output side, through current can reduced and the leak current of the circuit can be reduced.

In another aspect of the phase comparator, the state output circuit outputs a signal corresponding to the phase difference between at least the first and second comparators, based on the detection signal of the first and second edge detection circuits.

By adopting such a configuration, a signal corresponding to the phase difference between the first and second comparison target signals can be generated.

In another aspect of the present invention, when there is no phase difference between the first and second comparison target signals, the state output circuit outputs a signal for increasing the impedance of the tri-state circuit to the control terminal of the tri-state buffer. When there is a phase difference between the first and second comparison target signals, the state output circuit outputs a signal for flowing current for a period corresponding to the phase difference to the control terminal of the tri-state buffer and also outputs state signals corresponding to the phase advance or delay between the first and second comparison target signals to the status management circuit.

By adopting such a configuration, current flows through the tri-state circuit for a period corresponding to the phase difference between the first and second comparison target signals. If there is no phase difference, the impedance of the tri-state circuit can be set to a high level. Thus, the leak current of the tri-state circuit can be reduced.

The semiconductor device of the present invention can be obtained by forming on a semiconductor integrated circuit substrate a phase comparator comprising a first edge detection circuit for detecting the edge of the first comparison target signal, a second edge detection circuit for detecting the edge of the second comparison target signal, a phase difference signal generation circuit for outputting a signal corresponding to the phase difference between the first and second comparison target signals to the control terminal of the tri-state circuit and a status management circuit for outputting signals corresponding to the phase advance or delay between the first and second comparison target signals to the input terminal of the tri-state circuit.

According to the present invention, by simplifying the circuit of the phase comparator, signal delay in the circuits of the semiconductor device can be reduced and the phase difference detection accuracy of the comparison target signals can be improved. By using a tri-state circuit on the output side, through current can be reduced and accordingly, the leak current in the circuits of the semiconductor device can be reduced.

BRIEF DESCRIPTION OF THE DRAWINGS

FIG. 1 is the circuit diagram of a conventional phase comparator.

FIG. 5 shows an example of the tri-state buffer.

FIG. 7 shows the circuit diagram of the asynchronously designed phase comparator.

FIG. 8 is the timing chart of the asynchronously designed phase comparator.

FIG. 13 is the state transition chart of the state machine.

DESCRIPTION OF THE PREFERRED EMBODIMENTS

The preferred embodiments of the present invention are described with reference to the drawings. The phase comparator of the present invention comprises a first edge detection circuit for detecting a first comparison target signal, a second edge detection circuit for detecting a second comparison target signal, a phase difference signal generation circuit for outputting signals corresponding to the phase differences of the first and second comparison target signals to the control terminal of a tri-state circuit, based on the detection signals of the first and second edge detection circuits and a status management circuit for outputting signals corresponding to the phase advance or delay between the first and second comparison target signals to the input terminal of the tri-state circuit.

Figure 6:
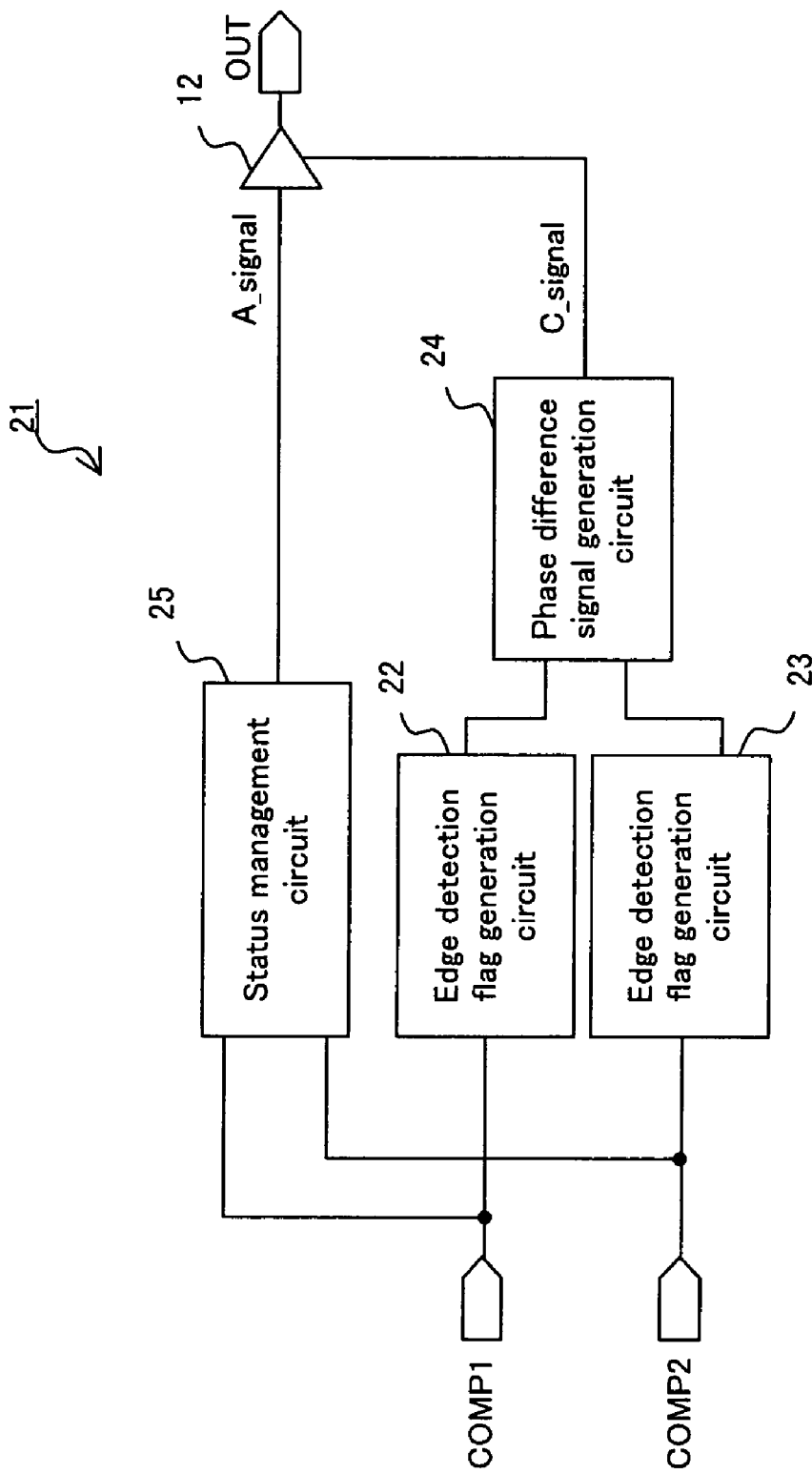
FIG. 6 is the circuit block diagram of the asynchronously designed phase comparator.

For example, the first and second edge detection circuits correspond to an edge detection flag generation circuit 22 shown in FIG. 6. The phase difference signal generation circuit corresponds to a phase difference signal generation circuit 24 shown in FIG. 6. The status management circuit corresponds to the status management circuit 25 shown in FIG. 6.

In another aspect of the phase comparator, the first or second edge detection circuit comprises a holding circuit for holding its own inverted output signal in timing synchronous with the start-UP of the first comparison target signal. For example, the holding circuit corresponds to a Type D flip-flop FF11 shown in FIG. 6.

Figure 2:
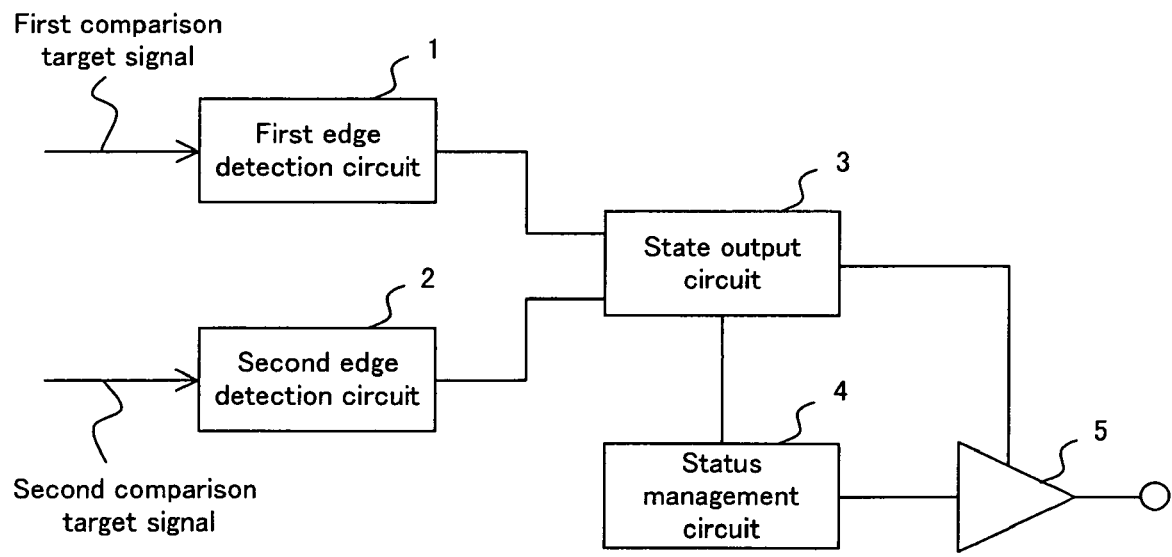
FIG. 2 shows the basic configuration of the phase comparator of the present invention.

FIG. 2 shows the basic configuration of another phase comparator of the present invention. In FIG. 2, the first edge detection circuit 1 detects the first comparison target signal in timing synchronous with a clock signal, and the second edge detection circuit 2 detects the second comparison target signal in timing synchronous with the clock signal. The state output circuit 3 outputs a signal corresponding to the phase difference between the first and second comparison target signals, based on the detection signals of the first and second edge detection circuits 1 and 2 to the control terminal of a tri-state circuit 5. The status management circuit 4 outputs a signal corresponding to phase advance or delay between the first and second comparison signals to the input terminal of the tri-state circuit 5.

Figure 9:
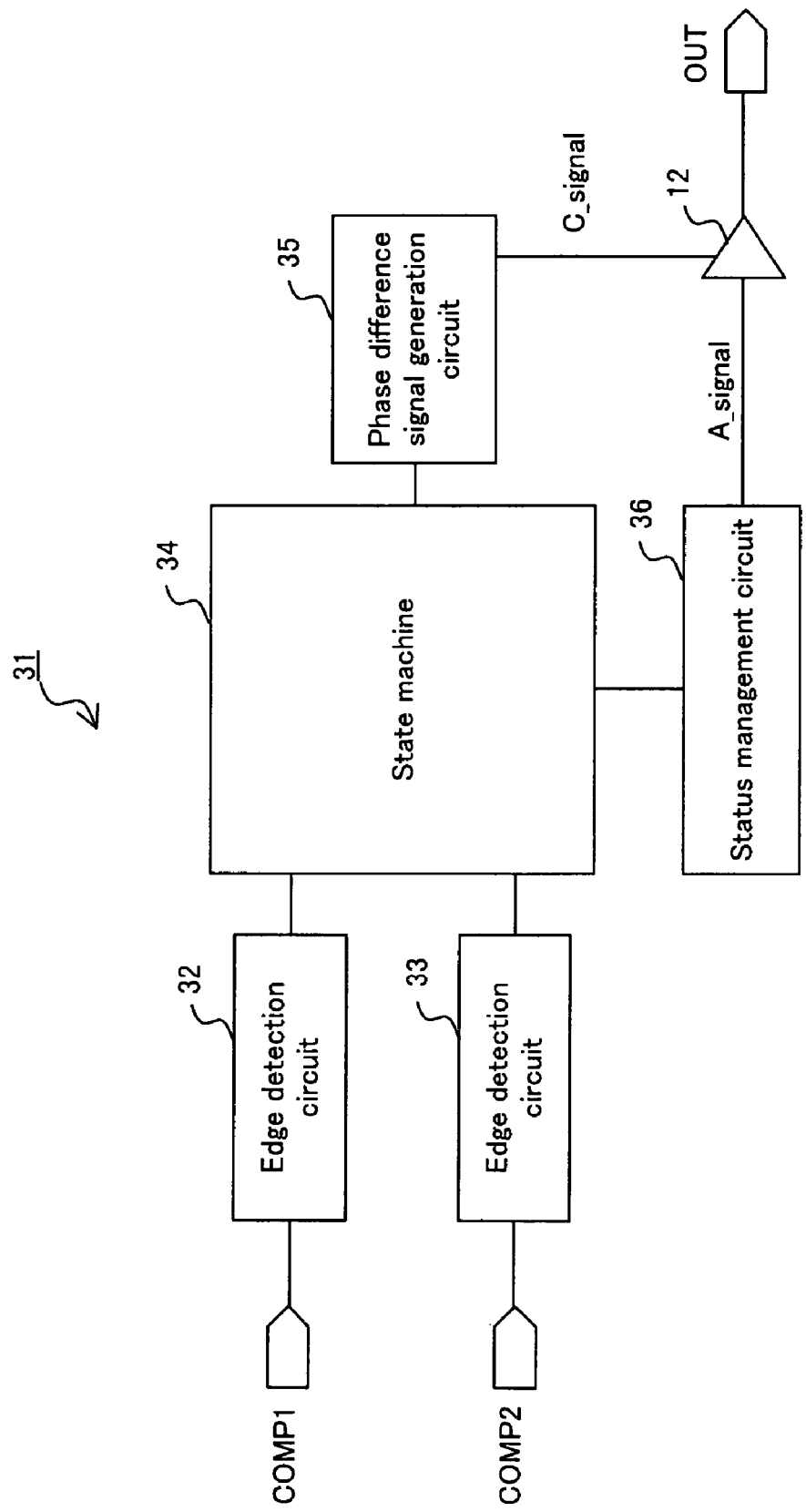
FIG. 9 is the circuit block diagram of the synchronously designed phase comparator.

For example, the first and second edge detection circuits 1 and 2 correspond to edge detection circuits 32 and 33, respectively, shown in FIG. 9. The state output circuit 3 corresponds to a state machine 34 and a phase difference signal generation circuit 35 shown in FIG. 9. The status management circuit 4 corresponds to a status management circuit 36 shown in FIG. 9. The tri-state circuit 5 corresponds to arty state buffer 12 shown in FIG. 9.

According to the above-mentioned configuration, in a synchronously designed phase comparator, the circuit of the phase comparator can be simplified, signal delay in the circuit can be reduced and the phase difference detection accuracy of a comparison target signal can be improved. By using a tri-state circuit on the output side, through current can be reduced and accordingly, the leak current of the circuit can be reduced.

Figure 3:
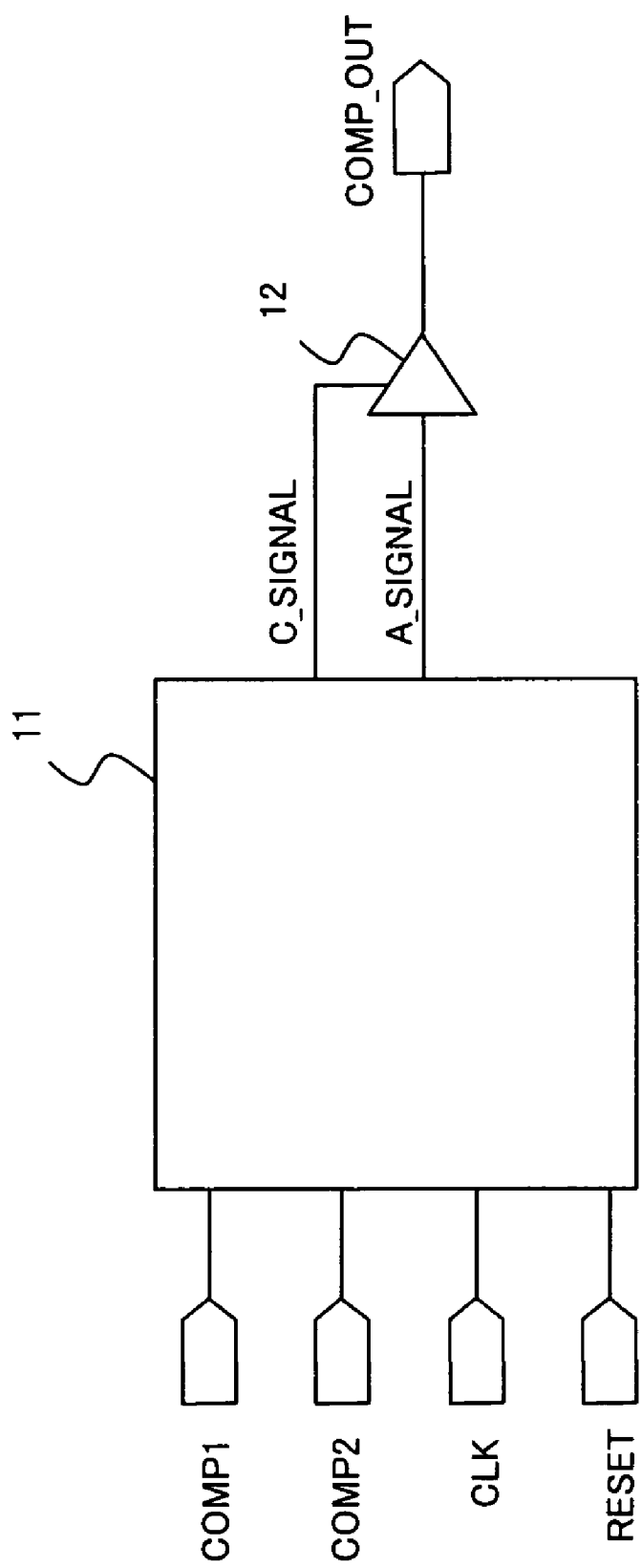
FIG. 3 shows the configuration of the phase comparator in one preferred embodiment.

FIG. 3 shows the phase comparator 11 and 3-state buffer (tri-state buffer) 12 in on preferred embodiment.

This phase comparator 11 is, for example, used in a PLL circuit for controlling the oscillation frequency of a voltage control oscillator and the like, and is formed on the semiconductor integrated circuit substrate.

In FIG. 3, the phase comparator 11 has input terminals for a comparison target signal COMP1 (corresponding to the first comparison target signal) and a comparison target signal COMP2 (corresponding to the second comparison target signal), a clock signal (CLK) and a reset signal (RESET). The phase comparator 11 also has an output terminal for supplying a signal C_SIGNAL to the control terminal of the tri-state buffer 12 and an output terminal for supplying a signal A_SIGNAL to the input terminal of the tri-state buffer 12.

Figure 4:
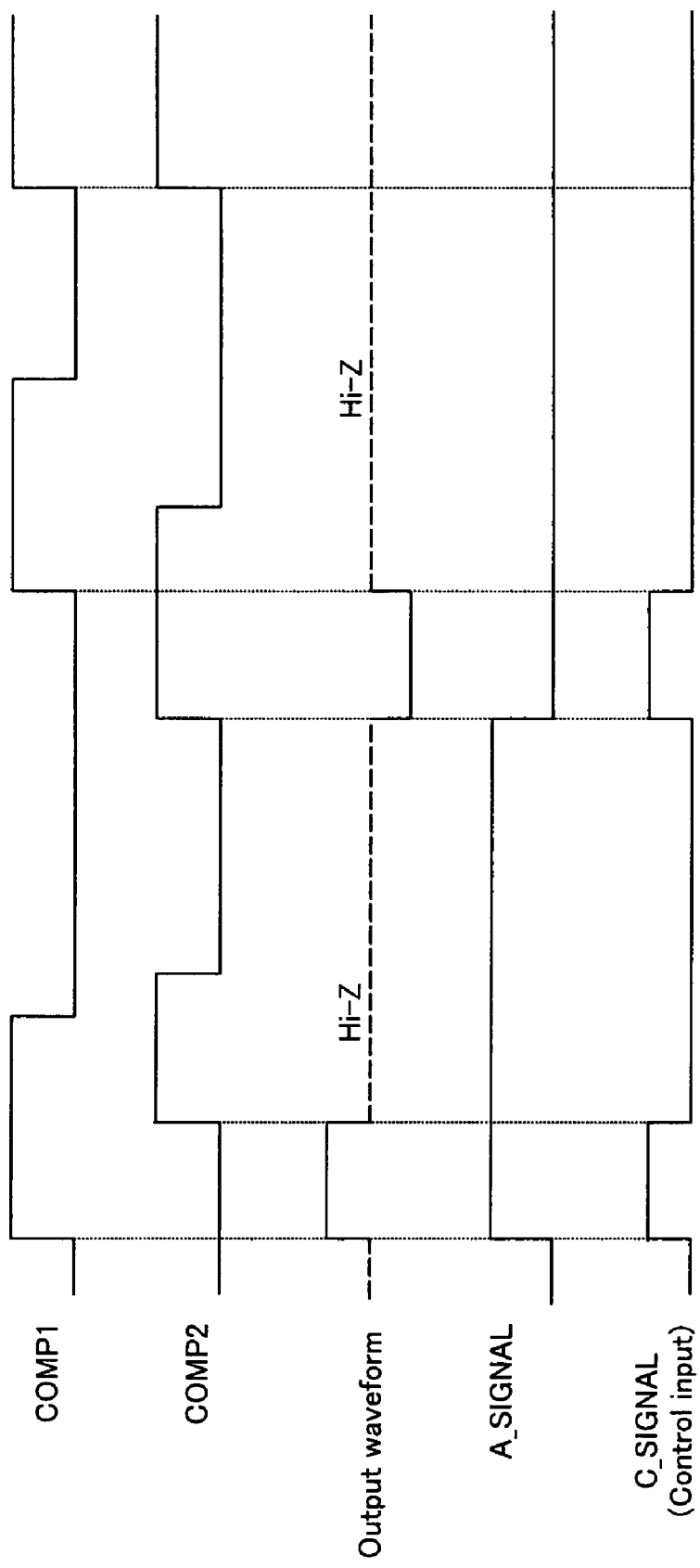
FIG. 4 is the timing chart of the phase comparator.

The function of this phase comparator 11 is described with reference to the timing chart shown in FIG. 4. If the phase of the comparison target signal COMP1 goes ahead of the phase the comparison target signal COMP2, a high-level signal C_SIGNAL (control input) is outputted from the phase comparator 11 to the control terminal of the tri-state buffer 12 for a period corresponding to phase difference between the comparison target signals COMP1 and COMP2. In this case, the high-level signal A_SIGNAL is outputted from the phase comparator 11 to the input terminal of the tri-state buffer 12.

Therefore, while the signal C_SIGNAL is at a high level, current flows through the tri-state buffer 12, and a high level signal is outputted from the output terminal of the tri-state buffer 12.

However, if the phase of the comparison target signal COMP 2 goes ahead of that of the comparison target COMP 1, a high-level signal C_SIGNAL is outputted from the phase comparator 11 to the control terminal of the tri-state buffer 12 for a period corresponding to the phase difference. In this case, a low-level signal A_SIGNAL is outputted from the phase comparator 11 to the input terminal of the tri-state buffer 12.

Therefore, while the signal C_SIGNAL is at a high level, current flows through the tri-state buffer 12, and a signal of a low level is outputted from the output terminal of the tri-state buffer 12.

While the signal C_SIGNAL is at a low level, the output of the tri-state buffer 12 has high impedance.

FIG. 5 shows one example of a tri-state buffer 12. In FIG. 5, the signal A_SIGNAL outputted from the phase comparator 11 is inputted to the gate of a p-channel MOS transistor TR1 and an n-channel MOS transistor TR2 that are connected in series between the power VDD and the ground. The connection point between the n-channel MOS transistor TR1 and the n-channel MOS transistor TR2 is connected to the gate of the p-channel MOS transistor TR3 and the n-channel MOS transistor TR4 in a subsequent stage. The connection point between the p-channel MOS transistor TR3 and the n-channel MOS transistor TR4 is connected to the drain of an n-channel MOS transistor TR5 and the source of a p-channel MOS transistor TR6 which are connected in parallel. Then, the signal C_SIGNAL outputted from the phase comparator 11 is supplied to the gate of the p-channel MOS transistor TR5, and a signal obtained by inverting the signal by an inverter INV1 is supplied to the gate of the p-channel MOS transistor TR6.

Therefore, while the signal C_SIGNAL is at a high level and the signal A_SIGNAL is at a high level, a high-level signal is outputted as an expected value output, and when the signal C_SIGNAL takes a low level, the expected value output takes high impedance. While the signal C_SIGNAL is at a high level and the signal A_SIGNAL is at a low level, a low-level signal is outputted as an expected value output.

FIG. 6 is the circuit block diagram of the asynchronously designed phase comparator 21. In FIG. 6, an edge detection flag generation circuit 22 detects the start-up edge of the comparison target signal COMP1 and outputs a detection signal synchronous with the start-up of the comparison target signal COMP1 to a phase difference signal generation circuit 24.

The edge detection flag generation circuit 23 detects the start-up edge of the comparison target signal COMP2 and outputs a detection signal synchronous with the start-up of the comparison target signal COMP2 to a phase difference signal generation circuit 24.

The phase difference signal generation circuit 24 outputs the signal C_SIGNAL that is at a high level for a period corresponding to the phase difference between the comparison target signals COMP1 and COMP2 to the control terminal of the tri-state buffer 12.

A status management circuit 25 outputs the signal A_SIGNAL corresponding to the phase advance or delay using one of the comparison target signal COMP1 or COMP2 as a reference to the input terminal of the tri-state buffer 12.

FIG. 7 shows an example of the circuit diagram of the asynchronously designed phase comparator 21. The edge detection flag generation circuit 22 comprises a Type D flip-flop FF11 whose D input terminal is connected to inverted output (hereinafter called "output Q bar") To the clock terminal of this type D flip-flop FF11, the comparison target signal COMP1 is inputted.

The phase difference signal generation circuit 24 comprises two AND circuits AND11 and AND12, and an OR circuit OR11 to which the respective outputs of the AND circuits AND 11 and AND12 are inputted. To the AND circuit AND11, the output Q bar (hereinafter called "output Q1 bar") of the type D flip-flop FF11 and the Output Q (hereinafter called "Q2 output") of the type D flip-flop FF12 are inputted. To the AND circuit AND12, the output Q bar (output Q2 bar) of the type D flip-flop FF12 and the output Q (output Q1) of the type D flip-flop FF11 are inputted. Then, the signal C_SIGNAL obtained by carrying out the logical OR between the signals is outputted from the OR circuit OR11 to the control terminal of the tri-state buffer 12.

The tri-state management circuit 25 comprises an inverter INV11, two OR circuits OR 12 and OR13, and a type D flip-flop FF13.

The OR circuit OR12 outputs a signal obtained by carrying out logical OR between a signal obtained by inverting the comparison target signal COMP2 and the comparison target signal COMP1 to the D input terminal of the type D flip-flop FF13. The OR circuit OR13 supplies a signal obtained by carrying out logical OR between the comparison target signals COMP1 and COMP2 to the clock terminal of the type D flip-flop FF13. The type D flip-flop FF13 latches the output signal of the OR circuit OR12 which is inputted to the D input terminal in timing synchronous with the start-up of the output signal of the OR circuit OR13, and outputs the latched signal to the input terminal of the tri-state buffer 12 as the signal A_SIGNAL.

Here, the circuit operation of an asynchronously designed phase comparator shown in FIG. 7 is described with reference to a timing chart shown in FIG. 8. In FIG. 8, an UP signal and a DOWN signal, which are outputted from the conventional phase comparator, are also shown. In the conventional phase comparator, when the phase of the comparison target signal COMP1 goes ahead of the phase of the comparison target signal COMP2, the UP signal is outputted. When the phase of the comparison target signal COMP1 goes behind the phase of the comparison target signal COMP2, the DOWN signal is outputted.

Firstly, the operation of the asynchronously designed phase comparator 21 in the case where the phase of the comparison target signal COMP1 goes ahead of the phase of the comparison target signal COMP2 is described.

If in the initial state, the Q1 output of the type D flip-flop FF11 of the edge detection flag generation circuit 22 is set at a low level, the Q1 output changes to a high level at the start-up edge of the comparison target signal COMP1 supplied to the clock terminal, and changes to a low level at the subsequent start-up of the comparison target signal COMP1.

Similarly, if in the initial state, the Q2 output of the type D flip-flop FF12 is set at a low level, the Q2 output changes to a high level at the start-up edge of the comparison target signal COMP2 supplied to the clock terminal, and changes to a low level at the subsequent start-up of the comparison target signal COMP2.

The output of the AND circuit AND12 takes a high level only while the Q1 output of the type D flip-flop FF11 is at a high level and while the output Q2 bar of the type D flip-flop FF12 is at a high level. Therefore, as shown in FIG. 8, the signal C_SIGNAL outputted from the OR circuit 11 takes a high level for a period corresponding to the phase difference between the comparison target signals COMP1 and COMP2.

In this case, since the comparison target signal COMP1 is at a high level, the output of the OR circuit OR12 of the status management circuit 25 takes a high level, and the high-level signal is outputted to the D input terminal of the type D flip-flop FF13. In this case, the output of the OR circuit OR13 takes a high level at the start-up edge of the comparison target signal COMP1, and the signal is outputted to the clock terminal of the type D flip-flop FF13.

Therefore, the high-level signal A_SIGNAL is outputted from the Output Q of the type D flip-flop FF13 of the status management circuit 25 to the input terminal of the tri-state buffer 12.

Therefore, if the phase of the comparison target signal COMP1 goes ahead of the phase of the comparison target signal COMP2, as shown in FIG. 8, the high-level signal A_SIGNAL is outputted from the phase comparator 21 to the input terminal of the tri-state buffer 12, and the signal C_SIGNAL which is at a high level for a period corresponding to the phase difference between the comparison target signals COMP1 and COMP2 is supplied to the control terminal of the tri-state buffer 12. Thus, the output of the tri-state buffer 12 takes a high level while the signal C_SIGNAL is at a high level, that is, takes power supply potential. When the output of the tri-state buffer 12 takes power supply potential, for example, the capacitor of the PLL circuit connected to the tri-state buffer 12 is charged. When the signal C_SIGNAL takes a low level, the output of the tri-state buffer 12 takes high impedance.

Next, the operation of the asynchronously designed phase comparator 21 in the case where the phase of the comparison target signal COMP2 goes ahead of the phase of the comparison target signal COMP1 (the phase of the comparison target signal COMP1 goes behind the phase of the comparison target signal COMP2) is described.

In this case, the Q2 output of the type D flip-flop FF12 takes a high level at the start-up edge of the comparison target signal COMP2, and takes a low level at the subsequent start-up edge of the comparison target signal COMP2. However, the output Q1 bar of the type D flip-flop FF11 takes a low level at the start-up edge of the comparison target signal COMP1.

Therefore, the signal C_SIGNAL which takes a high level at the start-up edge of the comparison target signal COMP2 and takes a low level at the start-up edge of the comparison target signal COMP1 is outputted from the phase difference signal generation circuit 24 to the control terminal of the tri-state buffer 12.

In this case, since the D input of the type D flip-flop FF13 of the status management circuit 35 is at a low level, the D input signal is latched in synchronization with the start-up edge of the comparison target signal COMP2. Then, the signal A_SIGNAL of a low level is outputted to the input terminal of the tri-state buffer 12.

Therefore, when the phase of the comparison target signal COMP2 goes ahead of the phase of the comparison target signal COMP1, as shown in FIG. 8, the signal A_SIGNAL of a low level is outputted from the phase difference comparator 21 to the input terminal of the tri-state buffer 12, and the signal C_SIGNAL which takes a high level for a period corresponding to the phase difference between the comparison target signals COMP1 and COMP2 is outputted to the control terminal of the tri-state buffer 12. Therefore, the output of the tri-state buffer 12 takes a low level, that is takes ground potential for the period corresponding to the phase difference. Thus, for example, the capacitor of the PLL circuit connected to the tri-state buffer 12 is discharged. When the signal C_SIGNAL takes a low level, the output of the tri-state buffer 12 takes high impedance.

According to the above mentioned asynchronously designed phase comparator, since the circuit configuration can be simplified and the signal delay in the logic circuits can be reduced, the phase difference detection accuracy of the comparison target signals can be improved. By using the tri-state buffer 12 on the output side, the flow of through current can be prevented.

FIG. 9 is the circuit block diagram of the synchronously designed phase comparator 31. In FIG. 9, am edge detection circuit 32 detects the comparison target signal COMP1 in timing synchronous with the clock signal and outputs a detection signal to a state machine 34.

The edge detection circuit 33 detects the comparison target signal COMP2 in timing synchronous with the clock signal and outputs a detection signal to a state machine 34.

The state machine 34 outputs a signal corresponding to the phase difference between the comparison target signals COMP1 and COMP2 to a phase difference signal generation circuit 35, based on the detection signal outputted from the edge detection circuit 32, and also outputs a state signal indicating the phase advance or delay between the comparison target signals COMP1 and COMP2 to a status management circuit 36.

The status management circuit 36 outputs the signal A_SIGNAL which takes a high or low level corresponding to the phase advance or delay between the comparison target signals COMP1 and COMP2 to the input terminal of the tri-state buffer 12.

Figure 10:
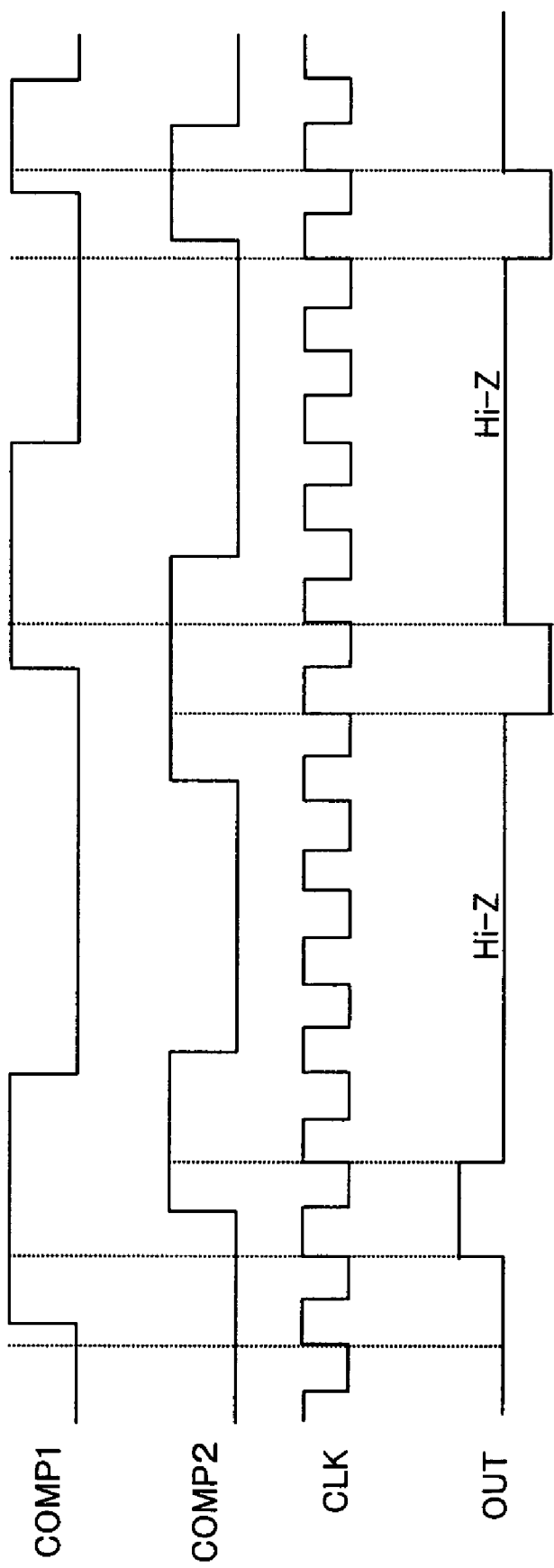
FIG. 10 shows the respective outputs of comparison target signals and the tri-state buffer.

FIG. 10 shows the respective outputs of comparison target signals COMP1 and COMP2, and the tri-state buffer. If the phase of the comparison target signal COMP1 goes ahead of the phase of the comparison target signal COMP2, as shown in FIG. 10, the output of the tri-state buffer 12 takes a high level (power supply potential) while the comparison target signal COMP1 is at a high level and in timing synchronous with the start-up edge of the clock signal CLK. While the comparison target signal COMP2 is at a high level and in timing synchronous with the start-up edge of the clock signal, the output of the tri-state buffer 12 takes high impedance.

If the phase of the comparison target signal COMP1 goes behind the phase of the comparison target signal COMP2, as shown in FIG. 10, the output of the tri-state buffer 12 takes a low level (ground potential) while the comparison target signal COMP2 is at a high level and in timing synchronous with the start-up edge of the clock signal. While the comparison target signal COMP1 takes a high level and in timing synchronous with the start-up edge of the clock signal, the output of the tri-state buffer 12 takes high impedance.

Figure 11:
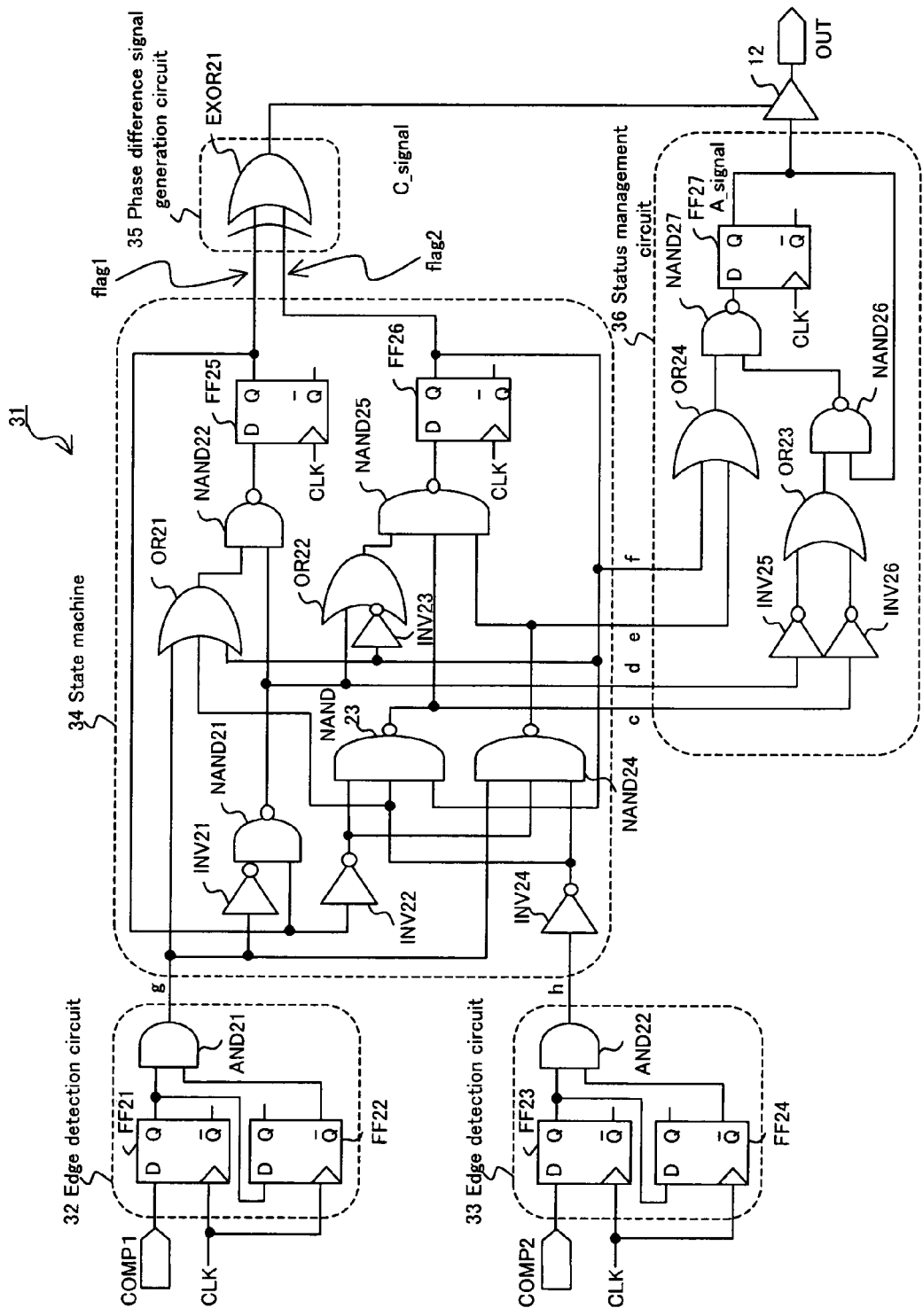
FIG. 11 shows the circuit diagram of the synchronously designed phase comparator.

FIG. 11 shows the circuit diagram of the synchronously designed phase comparator 31. In FIG. 11, the edge detection circuit 32 comprises a Type D flip-flop FF21 to whose D input terminal the comparison target signal COMP1 is inputted, a Type D flip-flop FF22 to whose D input terminal the Output Q of the Type D flip-flop FF21 is inputted and an AND circuit AND 21 to which the Output Q of the Type D flip-flop FF21 and the output Q bar of the type D flip-flop FF22 are inputted.

The Type D flip-flop FF21 of this edge detection circuit 32 latches the comparison target signal COMP1 at the start-up edge of the clock signal CLK. The Type D flip-flop FF22 latches the latched signal at the subsequent start-up edge of the clock signal. The AND circuit AND21 outputs a signal obtained by carrying out logical AND between the Output Q of the Type D flip-flop FF21 and the output Q bar of the type D flip-flop FF22 as a detection signal g.

Therefore, from the AND circuit AND21, the detection signal g which takes a high level at the start-up edge of the clock signal when the comparison target signal COMP1 takes a high level and takes a low level at the start-up edge of a subsequent clock signal is outputted.

The edge detection circuit 32 has the same circuit configuration as the edge detection circuit 32, and comprises two type D flip-flops FF23 and FF24, and an AND circuit AND 22.

From the AND circuit AND22 of this edge detection circuit 33, a detection signal h which takes a high level at the start-up edge pf the clock signal when the comparison target signal COMP2 takes a high level and takes a low level at the start-up edge of a subsequent clock signal is outputted.

The detection signal g of the edge detection circuit 32 is inputted to the OR circuit OR21 of the stat machine 34, an inverter INV 21 and a three-input NAND circuit NAND24.

To one input of a NAND circuit NAND21, the output of an inverter 21 is inputted. And to the other input, the Output Q of the Type D flip-flop FF25 is inputted. The Output Q of this Type D flip-flop FF25 is also inputted to the three-input NAND circuits NAND23 and NAND24 through an inverter INV22.

The output of the NAND circuit NAND21 is inputted to the NAND circuit NAND22, and also is outputted to the status management circuit 36 as a state signal d.

The output of the NAND circuit NAND22 is inputted to the D input terminal of the Type D flip-flop FF25. The Type D flip-flop FF25 latches a signal inputted to the Type D input terminal at the startup edge of the clock signal, and outputs the latched signal to the phase difference signal generation circuit 35 as a signal flag1.

To the other input of the NAND circuit NAND22, the output of the three-input OR circuit OR21 is inputted. To the three-input OR circuit OR21, the detection signal g of the above mentioned detection circuit 32, a signal obtained by inverting the detection signal h of the edge detection circuit33 by an inverter INV24 and the Output Q of a Type D flip-flop FF26 are inputted.

To the three-input NAND circuit NAND23, a signal obtained by inverting the Output Q of the Type D flip-flop FF25 by the inverter INV22, a signal obtained by inverting the detection signal h of the edge detection circuit 33 and the Output Q of the Type D flip-flop FF26 are inputted. The output of this three-input NAND circuit NAND 23 is inputted to the three-input NAND circuit NAND25, and also is outputted to the status management circuit 36 as a state signal c.

The output of three-input NAND CIRCUIT NAND25 is inputted to the D input terminal of the Type D flip-flop FF26. The Type D flip-flop FF26 latches the input signal of the D input terminal at the start-up edge of the clock signal, and outputs the latched signal to the phase difference signal generation circuit 35 as a signal flag2. This signal flag2 is outputted to the status management circuit 36 as a state signal f.

To the other input of the three-input NAND circuit NAND25, the output of the three-input NAND circuit NAND24 and the output of the OR circuit OR22 are inputted. To the OR circuit OR22, the output of the above-mentioned NAND circuit NAND21 and a signal obtained by inverting the Output Q of the Type D flip-flop FF26 by an inverter INV23 are inputted.

To the three-input NAND circuit NAND24, the detection signal g of the edge detection circuit 32, a signal obtained by inverting the Output Q of the Type D flip-flop FF25 by the inverter INV22 and a signal obtained by inverting the detection signal h of the edge detection circuit 33 by the inverter INV24 are inputted. The output of this NAND circuit NAND24 is outputted to the status management circuit 36 as a state signal e.

The phase difference signal generation circuit 35 comprises an exclusive logical OR circuit EXOR21, and outputs a signal obtained by exclusive OR between the signals flag1 and flag2 outputted from the state machine 34 to the control terminal of the tri-state buffer 12 as the signal C_SIGNAL.

The exclusive logical OR circuit EXOR21 of the phase difference signal generation circuit 35 can also be incorporated into the state machine 34 as one state machine 34.

To the inverter INV25 of the status management circuit 36, the state signal d outputted from the state machine 34 is inputted, and to an inverter INV26, the state signal c is inputted. The respective output of the inverters INV25 and INV26 are inputted to the OR circuit OR23, and the output of the OR circuit OR23 is inputted to the NAND circuit NAND26. The output of the NAND circuit NAND26 is inputted to a NAND circuit NAND27.

To the OR circuit OR24, the state signals e and f outputted from the state machine 34 are inputted, and the output is inputted to the NAND circuit NAND27.

A type D flip-flop FF27 latches the output signal of the NAND circuit NAND27 at the start-up edge of the clock signal, and outputs the latched Output Q to the input terminal of the tri-state buffer 12 as the signal A_SIGNAL. The type D flip-flop FF27 outputs the Output Q to the NAND circuit NAND26.

Next, the operation of the synchronously designed phase difference comparator 31 with such a configuration is described with reference to a timing chart shown in FIG. 12.

Firstly, the operation of the state machine 31 in the case where the phase of the comparison target signal COMP2 goes ahead of the phase of the comparison target signal COMP1 (the phase of the comparison target signal COMP1 goes behind the phase of the comparison target signal COMP2) is described.

In this case, from the edge detection circuit 33, a detection signal h that takes a high level at the start-up edge of the clock signal while the comparison target signal COMP2 is at a high level, and takes a low level at the start-up edge of a subsequent clock signal is outputted. In this case, the detection signal g of the edge detection circuit 32 is at a low level.

When the detection signal h of the edge detection circuit 33 changes from a low level to a high level, the signal is inverted by the inverter 24 INV24, and is inputted to the three-input OR circuit OR21 as a low-level signal. In this case, since the two other inputs of the three-input OR circuit OR21 are at a low level, the output of the OR circuit OR21 changes to a low level.

When the output of the OR circuit OR21 changes to a low level, the output of the NAND circuit NAND22 changes to a high level. In this case, if there is no phase difference between comparison target signals COMP1 and COMP2, the output of the NAND circuit NAND22 is at a low level.

Since the output of the NAND circuit NAND22 is inputted to the D input terminal of the Type D flip-flop FF25, if the output of the NAND circuit NAND22 takes a high level, the high-level signal is latched at the start-up edge of the clock signal, the Output Q of the type D flip-flop FF25 changes to a high level.

When the comparison target signal COMP1 changes to a high level after time corresponding to the phase difference between the comparison target signals COMP2 and COMP1 elapse, the change of the signal is detected by the edge detection circuit 32, and the detection signal g changes to a-high level. As a result, the output of the NAND circuit NAND21 changes to a high level, and the output of the NAND circuit NAND22 changes to a low level. When the input signal of the D input terminal of the type D flip-flop FF25 changes to a low level, the low-level signal is latched at the start-up edge of a subsequent clock signal and the Output Q (signal flag1) changes to a low level.

Figure 12:
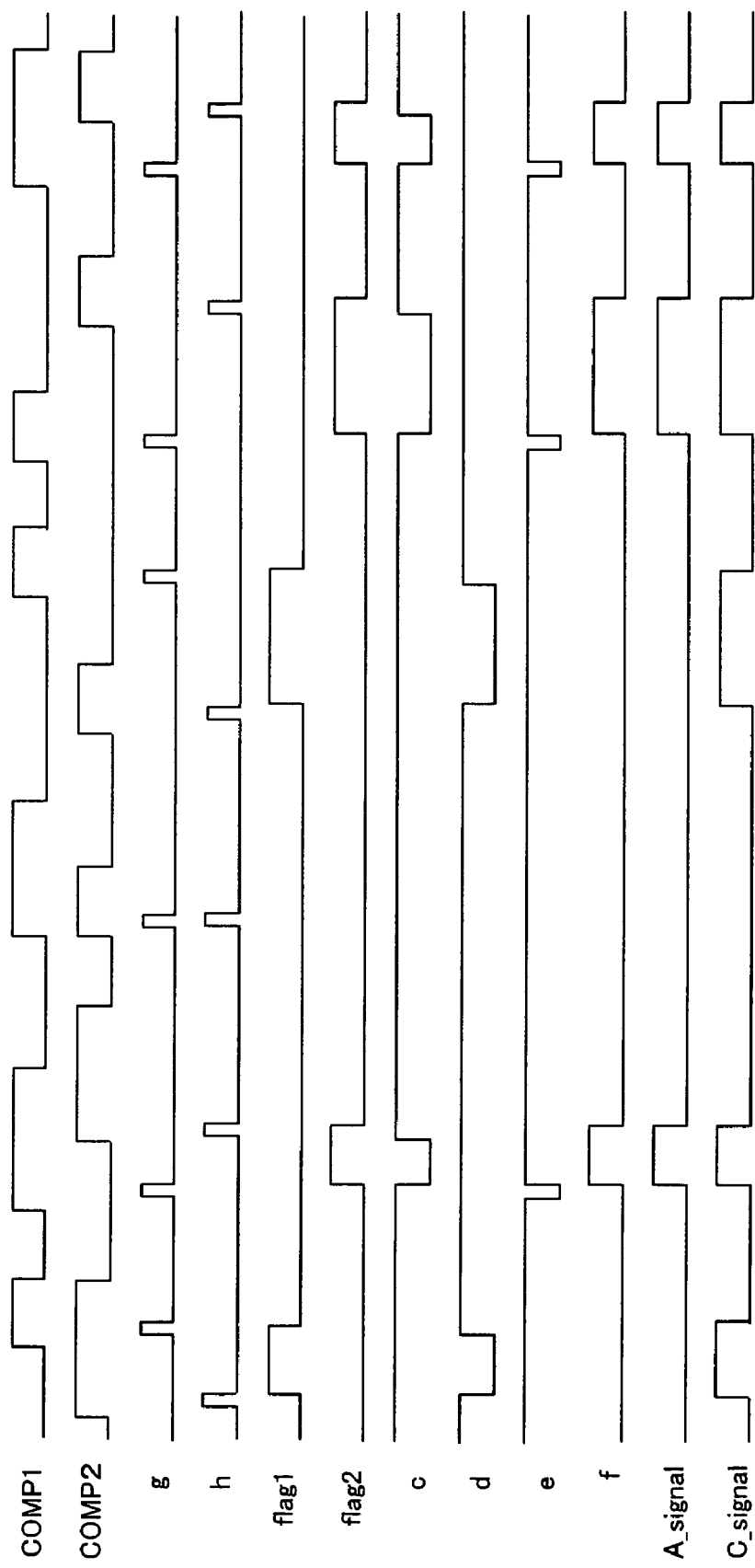
FIG. 12 is the timing chart of synchronously designed phase comparator.

Specifically, if the phase of the comparison target signal COMP2 goes ahead of the phase of the comparison target signal COMP1, the signal flag1 which takes a high level for a period corresponding to the phase difference between the comparison target signals COMP2 and COMP1 is outputted from the state machine 34 to the exclusive logical OR circuit EXOR21 (see FIG. 12). In this case, since the Output Q of the Type D flip-flop FF26 maintains a low level, the signal flag2 maintains a low level.

Therefore, as shown in FIG. 12, from the exclusive logical OR circuit EXOR21, the signal C_SIGNAL which takes a high level for a period corresponding to the phase difference between comparison target signals COMP2 and COMP1 id outputted. By this high-level signal C_SIGNAL, current flows through the tri-state buffer 12.

Nest, in the above mentioned case, the state signals c, d, e and f outputted from the state machine 34 to the status management circuit 36 are described.

Even if the detection signal g of the edge detection circuit changes, the output of the three-input NAND circuit NAND23 is maintained at a high level. In this case, as shown in FIG. 12, the state signal c is maintained at a high level.

If the Output Q of the type D flip-flop FF25 changes to a high level, the output of the NAND circuit NAND21 changes to a low level. In this case, as shown in FIG. 12, the state signal d takes a low level only while the signal flag 1 is at a high level.

Since the output of the three-input NAND circuit NAND24 is maintained at a high level even when the detection signal of the edge detection circuit 33 changes, as shown in FIG. 12, the state signal e is maintained at a high level.

Since the Output Q of the type D flip-flop FF26, that is, flag2 is maintained at a low level, as shown in FIG. 12, the state signal f is maintained at a low level.

Next, the operation of the status management circuit 36 in the case where the phase of the comparison target signal COMP2 goes ahead of the phase of the comparison target signal COMP1 is described.

When the state signals c and d are at a high level, the output of the OR circuit OR23 of the status management circuit 36 is at a low level, and the output of the NAND circuit NAND26 is at a high level. When the state signal e is at a high level and the state signal f is at a low level, the output of the OR circuit OR24 is at a high level. In this case, the signal A_SIGNAL, which is the output Q of the type D flip-flop FF27, is at a low level.

Even if in this state, the state signal d changes to a low level, the output of the MAND circuit NAND26 maintains a high level. Therefore, the signal A_SIGMAL, which is the type D flip-flop FF27 maintains a low level.

Therefore, if the phase of the comparison target signal COMP2 goes ahead of the phase of the comparison target signal COMP1, as shown in FIG. 12, the signal A_SIGNAL outputted from the status management circuit 36 takes a low level.

As described above, if the phase of the comparison target signal COMP2 goes ahead of the phase of the comparison target signal COMP1, from the phase difference signal generation circuit 35, the high-level signal C_SIGNAL is outputted to the control terminal of the tri-state buffer 12 for a period corresponding to the phase difference. Simultaneously, from the status management circuit 36, the signal A_SIGNAL of a low level is outputted to the input terminal of the tri-state buffer 12. Thus, from the tri-state buffer 12, a low-level signal is outputted.

Next, the operation of the state machine in the case where the phase of the comparison target signal COMP1 goes ahead of the phase of the comparison target signal COMP2 is described.

In this case, the detection signal g which takes a high level at the start-up edge of the clock signal while the comparison target signal COMP1 is at a high level and takes a low level at the start-up edge of a subsequent clock signal is outputted from the edge detection circuit 32. In this case, the detection signal h of the edge detection circuit 33 is at a low level.

When the detection signal g of the edge detection circuit 32 changes to a high level, the input of the three-input NAND circuit NAND24 changes to a high level, and the output changes to a low level. When the output of the three-input NAND circuit NAND24 changes to a low level, the output of the three-input NAND 25 changes to a high level. Since the output of this three-input NAND circuit NAND25 is inputted to the D input terminal of the Type D flip-flop FF26, the high-level signal is latched at the start-up edge of the clock signal, and the Output Q of the type D flip-flop FF26, that is, signal flag2 changes to a high level.

When the output Q of the type D flip-flop FF26 changes to a high level, the inputs of the three-input NAND circuits NAND23 all take high levels, and the output takes a low level. Then, the output of the NAND circuit NAND25 takes a high level, and the output Q of type D flip-flop FF26 maintains a high level.

Next, when the comparison target signal COMP2 changes to a high level after time corresponding to the phase difference between the comparison target signals COMP2 and COMP1 elapses, the signal change is detected by the edge detection circuit 33, and the detection signal h changes to a high level.

When the detection signal h takes a high level, the output of the three-input NAND circuit NAND23 changes to a high level, the output of the NAND circuit NAND25, that is, the D input signal of the type D flip-flop FF26 changes to a low level and the output Q of the type D flip-flop FF26 takes a low level. Thus, the signal flag2 changes to a low level.

Therefore, if the phase of the comparison target signal COMP1 goes ahead of the phase of the comparison target signal COMP2, as shown in FIG. 12, from the state machine 34, the signal flag2 which is at a high level for a period corresponding to the phase difference between the comparison target signals COMP1 and COMP2 is outputted. In this case, the signal flag1 maintains a low level.

Thus, as shown in FIG. 12, from the exclusive logical OR circuit EXCOR21, the signal C_SIGNAL which takes a high level for a period corresponding to the phase difference between the comparison target signals COMP1 and COMP2 is outputted. By this high-level signal C_SIGNAL, current flows through the tri-state buffer 12.

Next, the state signals c, d, e and f outputted from the state machine 34 to the status management circuit 36 in the above mentioned case are described.

Firstly, the state signal e is described. When the detection signal g of the edge detection circuit 32 changes to a high level for one clock cycle period, the output of the three-input NAND circuit NAND24 changes to a low level. When the detection signal g takes a low level, the output of the three-input NAND circuit NAND24 changes to a high level.

Therefore, as shown in FIG. 12, the state signal e, which is the output signal of the three-input NAND circuit NAND24 takes a low level only while the detection signal g of the edge detection circuit 32 is at a high level.

The state signal f is the same as the output signal flag2 of the above-mentioned type D flip-flop FF26, and takes a high level for a period corresponding to the phase difference between comparison target signals COMP1 and COMP2.

The state signal c is the same as the output signal of the three-input NAND circuit NAND 23, and is usually at a high level. When the output signal flag2 of the type D flip-flop FF26 changes to a high level, the output of the three-input NAND circuit NAND23 changes to a low level. Then, when the detection signal h of the edge detection circuit 33 changes to a high level, the output of the three-input NAND circuit NAND23 changes to a high level. As shown in FIG. 12, the state signal d maintains a high level.

Next, the operation of the status management circuit 36 in the case where the phase of the comparison target signal COMP1 goes ahead of the phase of the comparison target signal COMP2 is described.

When the state signal e changes to a low level, the output of the OR circuit OR24 changes to a low level, and the D input signal of the type D flip-flop FF27 changes to a high level. The high-level input signal is latched at the start-up edge of the clock signal, and the signal A_SIGNAL, which is the output Q, changes to a high level.

Then, when the detection signal h of the edge detection circuit 33 changes to a high level after time corresponding to the phase difference between comparison target signals COMP1 and COMP2 elapses, the state signal c takes a high level, and the output of the OR circuit OR23 changes to a low level. Thus, the output of the NAND circuit NAND27 changes to a low level, and the low-level signal is latched by the type D flip-flop FF27 at the start-up edge of the clock signal. As a result, the signal A_SIGNAL, which is the output Q of the type D flip-flop FF27, changes to a low level.

Therefore, if the phase of the comparison target signal COMP1 goes ahead of the phase of the comparison target signal COMP2, as shown in FIG. 12, from the status management circuit 36, the signal A_SIGNAL which is at a high level for a period corresponding to the phase difference is outputted.

As described above, if the phase of the comparison target signal COMP1 goes ahead of the phase of the comparison target signal COMP2, from the phase difference signal generation circuit 35, the high-level control signal C_SIGNAL is outputted to the control terminal of the tri-state buffer 12 only for a period corresponding to the phase difference. From the status management circuit 36, the high-level signal A_SIGNAL is also outputted to the input terminal of the tri-state buffer 12. Thus, from the tri-state buffer 12, a signal which is at a high level for a period corresponding to the phase difference between two comparison target signals is outputted.

If the phase of the comparison target signal coincides with the phase of the comparison target signal COMP2, the signals flag1 and flag2 both take low levels, the state signals c, d and e take high levels and the state signal f takes a low level.

Therefore, the output of the exclusive logical OR circuit EXCOR21 takes a low level, and the output of the status management circuit 36 tales a low level. Accordingly, the output of the tri-state buffer 12 takes high impedance.

The state of the state machine 34 is described with reference to the state transition chart shown in FIG. 13.

If there is no phase difference between the comparison target signals COMP1 and COMP2, the signals flag1 and flag2 both maintain low levels since the detection signals g and h are simultaneously outputted from the edge detection circuits 32 and 33, respectively.

If the phase of the comparison target signal COMP2 goes ahead of the phase of the comparison target signal COMP1, the detection signal h of the edge detection circuit 33 changes to a high level ("1") at the start-up edge of the clock signal when the comparison target signal COMP2 changes from a low level to a high level. Since in this case, the detection signal g of the edge detection circuit 32 remains at a low level ("0"), the signals flag1 and flag2 which are outputted from the state machine 34 take high and low levels, respectively. Then, when the change of the comparison target signal COMP1 is detected by the edge detection circuit 32 and the detection signal g changes to a high level ("1"), the signal flag1 changes to a low level.

If the phase of the comparison target signal COMP1 goes ahead of the phase of the comparison target signal COMP2, the detection signal g of the edge detection circuit 32 changes to a high level ("1") at the start-up edge of the clock signal when the comparison target signal COMP1 changes from a low level to a high level. In that case, the detection signal h of the edge detection circuit 33 remains at a low level ("0"). As a result, from the state machine 34, the low-level signal flag1 and the hi-level signal flag2 are outputted.

When the change of the comparison target signal COMP2 is detected by the edge detection circuit 33 after time corresponding to the phase difference between the two signals elapses, and the detection signal h changes to a high level ("1"), the signal flag2 changes to a low level.

According to the above-mentioned synchronously designed phase comparator 31, by a circuit configuration with a small number of logical stages, the signal C_SIGNAL corresponding to the phase difference between the comparison target signals COMP1 and COMP2 and the signal A_SIGNAL which takes a high or low level according to the phase advance or delay of the comparison target signals can be generated and be supplied to the tri-state buffer 12. Since in this synchronously designed phase comparator, a logic circuit configuration can be simplified, signal delay in the phase comparator can be reduced and accordingly, the phase difference detection accuracy can be improved. Furthermore, by using the tri-state buffer 12, current can be prevented from flowing through the transistors of the charge pump. Accordingly, the leak current in the circuits can be reduced.

According to the present invention, by simplifying the circuits of the phase comparator, internal signal delay can be reduced, and accordingly, the phase difference detection accuracy of the comparison target signals can be improved. By using a tri-state circuit on the output side, through current can be reduced, and accordingly, the leak current in the circuits can be reduced.

The present invention is not limited to the above-mentioned preferred embodiments, and, for example, can also be configured as follows.

The circuits of the asynchronously and synchronously designed phase comparators are not limited to the circuits shown in the preferred embodiments, and any logic circuit can be used as long as it can supply an aimed signal to a tri-state circuit.

The state signals outputted from the state machine 34 to the status management circuit 36 are not limited to four types of signals, and a fewer number of signals can also be used. Instead of the state machine 34 supplying the state signals, the status management circuit 36 can also determine the phase advance or delay of the comparison target signals, based on the detection signals outputted from the edge detection circuits 32 and 33.

The circuit controlled by the phase comparator is not limited the tri-state buffer 12, and it can be any circuit capable of switching three states including high impedance.

What is claimed is:

1. A phase comparator, comprising:
a first edge detection circuit for detecting a first comparison target signal;
a second edge detection circuit for detecting a second comparison target signal;
a phase difference signal generation circuit for outputting a signal corresponding to a phase difference between the first and second comparison target signals to a control terminal of a tri-state circuit, based on a detection signal of the first and second detection circuits; and
a status management circuit for outputting a signal corresponding to a phase advance or delay of the first and second comparison target signals to an input terminal of the tri-state circuit,
wherein the status management circuit outputs a first-state signal either at a high level or at a low level to an input terminal of a tri-state buffer in timing synchronous with the start-up of the first comparison target signal when the phase of the first comparison target signal is ahead of the phase of the second comparison target signal, and when the second comparison target signal changes, the status management circuit continues to output the first-state signal whose state is the same as before the second comparison target signal changes.

2. The phase comparator according to claim 1, wherein said first or second edge detection circuit comprises a first holding circuit for holding its own inverted output signal in timing synchronous with the start-up of the first comparison target signal.

3. The phase comparator according to claim 1, wherein said status management circuit comprises a first OR circuit for carrying out a logical OR operation between the first comparison target signal and a signal obtained by inverting the second comparison target signal, a second OR circuit for carrying out a logical OR operation between the first and second comparison target signals and a holding circuit for holding the output signal of the first OR circuit in timing synchronous with the output signal of the second OR circuit.

4. The phase comparator according to claim 1, wherein said phase difference signal generation circuit outputs a detection signal of the first edge detection circuit and a signal having a state determined by a detection signal of the second edge detection circuit.

5. The phase comparator according to claim 1, wherein said status management circuit comprises a first AND circuit for carrying out a logical AND operation between an inverted signal of a detection signal of the first edge detection circuit and a detection signal of the second edge detection circuit, a second AND circuit for carrying out a logical AND operation between a detection signal of the first edge detection circuit and an inverted signal of a detection signal of the second edge detection circuit and an OR circuit for carrying out a logical OR operation between respective output signals of the first and second AND circuits.

6. A phase comparator, comprising:
a first edge detection circuit for detecting a first comparison target signal in timing synchronous with a clock signal;
a second edge detection circuit for detecting a second comparison target signal in timing synchronous with the clock signal;

a state output circuit for outputting a signal corresponding to a phase difference between the first and second comparison target signals to a control terminal of a tri-state circuit, based on a detection signal of the first and second edge detection circuits; and a status management circuit for outputting a signal corresponding to a phase advance or delay of the first and second comparison target signals to an input terminal of the tri-state circuit, wherein the status management circuit outputs a first-state signal either at a high level or at a low level to an input terminal of a tri-state buffer in timing synchronous with the start-up of the first comparison target signal when the phase of the first comparison target signal is ahead of the phase of the second comparison target signal, and when the second comparison target signal changes, the status management circuit continues to output the first-state signal whose state is the same as before the second comparison target signal changes.

7. The phase comparator according to claim 6, wherein said state output circuit outputs a signal corresponding to a phase difference between the first and second comparison target signals, based on a detection signal of the first and second edge detection circuits.

8. The phase comparator according to claim 6, wherein when there is no phase difference between the first and second comparison target signals, said state output circuit outputs a signal for enabling the tri-state circuit to take high impedance to a control terminal of the tri-state circuit, and when there is a phase difference between the comparison target signals, said state output circuit outputs a signal for enabling current to flow for a period corresponding to a phase difference to the control terminal, and also outputs a signal corresponding to a phase advance or delay of the first and second comparison target signals to the status management circuit.

9. A phase comparator, comprising:

a first edge detection circuit for detecting a first comparison target signal in timing synchronous with a clock signal;

a second edge detection circuit for detecting a second comparison target signal in timing synchronous with the clock signal;

a state output circuit for outputting a signal corresponding to a phase difference between the first and second comparison target signals to a control terminal of a tri-state circuit, based on a detection signal of the first and second edge detection circuits; and a status management circuit for outputting a signal corresponding to a phase advance or delay of the first and second comparison target signals to an input terminal of the tri-state circuit, wherein said first or second edge detection circuit comprises a first holding circuit for holding the first comparison target signal in timing synchronous with a clock signal, a second holding circuit for holding the second comparison target signal in timing synchronous with a clock signal and an AND circuit for carrying out logical AND between the output signal of the first holding circuit and an inverted output signal of the second holding circuit.

10. The phase comparator according to claim 6, wherein said status management circuit outputs a signal indicating a phase advance or delay of the first and second target signals to an input terminal of the tri-state circuit, based on a state signal outputted from the state output circuit.

11. A phase comparator, comprising:

a first edge detection circuit for detecting a first comparison target signal in timing synchronous with a clock signal;

a second edge detection circuit for detecting a second comparison target signal in timing synchronous with the clock signal;

a state output circuit for generating a signal corresponding to a phase difference based on a detection signal of the first edge detection circuit and a detection signal of the second edge detection circuit and outputting a state signal indicating a phase advance or delay of the first and second comparison target signals;

a status management circuit for outputting a signal corresponding to a phase advance or delay of the first and second comparison target signals to an input terminal of the tri-state circuit, wherein the status management circuit outputs a first-state signal either at a high level or a low level to an input terminal of a tri-state buffer in timing synchronous with the start-up of a first detection signal of the first edge detection circuit when the phase of the first comparison target signal is ahead of the phase of the second comparison target signal, and when the second comparison target signal changes, the status management circuit continues to output the first-state signal whose state is the same as before the second comparison target signals changes; and a phase difference signal generation circuit for outputting a signal corresponding to a phase difference between the first and second comparison target signals to a control terminal of a tri-state circuit, based on the signal of the state output circuit.

12. The phase comparator according to claim 11, wherein when there is no phase difference between the first and second comparison target signals, said state output circuit outputs a signal for enabling the output of the tri-state circuit to take high impedance to the control input of the tri-state circuit, and when there is a phase difference between the first and second comparison target signals, said state output circuit outputs a signal for enabling current to flow through the tri-state circuit to a control terminal of the tri-state buffer.

13. A semiconductor device having a phase comparator, said phase comparator, comprising:

a first edge detection circuit for detecting a first comparison target signal;

a second edge detection circuit for detecting a second comparison target signal;

a phase difference signal generation circuit for outputting a signal corresponding to a phase difference between the first and second comparison target signals to a control terminal of a tri-state circuit, based on a detection signal of the first and second detection circuits; and a status management circuit for outputting a signal corresponding to a phase advance or delay of the first and second comparison target signals to an input terminal of the tri-state circuit, wherein the status management circuit outputs a first-state signal either at a high level or at a low level to an input terminal of a tri-state buffer in timing synchronous with the start-up of the first comparison target signal when the phase of the first comparison target signal is ahead of the phase of the second comparison target signal, and when the second comparison target signal changes, the status management circuit continues to output the first-state signal whose state is the same as before the second comparison target signal changes.

14. The semiconductor device according to claim 13, wherein
said first or second edge detection circuit comprises a first holding circuit for holding its own inverted output signal in timing synchronous with the start-up of the first comparison target signal.

15. The semiconductor device according to claim 13, wherein the signal output by the status management circuit to the input terminal of the tri-state circuit corresponds to the phase advance or delay of the comparison target signals.

16. The semiconductor device according to claim 13, wherein
said status management circuit comprises a first OR circuit for carrying out logical OR operation between the first comparison target signal and a signal obtained by inverting the second comparison target signal, a second OR circuit for carrying out a logical OR operation between the first and second comparison target signals and a holding circuit for holding the output signal of the first OR circuit in timing synchronous with the output signal of the second OR circuit.

17. The semiconductor device according to claim 13, wherein
said phase difference signal generation circuit outputs a signal whose state is determined based on a detection signal of the first edge detection circuit and a detection signal of the second edge detection circuit.

18. The semiconductor device according to claim 13, wherein
said status management circuit comprises a first AND circuit for carrying out a logical AND operation between an inverted signal of a detection signal of the first edge detection circuit and a detection signal of the second edge detection circuit, a second AND circuit for carrying out logical AND operation between a detection signal of the first edge detection circuit and an inverted signal of a detection signal of the second edge detection circuit and an OR circuit for carrying out logical OR operation between respective output signals of the first and second AND circuits.

19. A semiconductor device having a phase comparator, said phase comparator, comprising:
a first edge detection circuit for detecting a first comparison target signal in timing synchronous with a clock signal;
a second edge detection circuit for detecting a second comparison target signal in timing synchronous with the clock signal;
a state output circuit for outputting a signal corresponding to a phase difference between the first and second comparison target signals to a control terminal of a tri-state circuit, based on a detection signal of the first and second edge detection circuits; and
a status management circuit for outputting a signal corresponding to a phase advance or delay of the first and second comparison target signals to an input terminal of the tri-state circuit,
wherein the status management circuit outputs a first-state signal either at a high level or at a low level to an input terminal of a tri-state buffer in timing synchronous with the start-up of the first comparison target signal when the phase of the first comparison target signal is ahead of the phase of the second comparison target signal, when the second comparison target signal changes, the status management circuit continues to output the first-state signal whose state is the same as before the second comparison target signal changes.

20. The semiconductor device according to claim 19, wherein
said state output circuit outputs a signal corresponding to a phase difference between the first and second comparison target signals, based on a detection signal of the first and second edge detection circuits.

21. A semiconductor device on whose semiconductor integrated circuit substrate is formed a phase comparator, said phase comparator, comprising:
a first edge detection circuit for detecting a first comparison target signal in timing synchronous with a clock signal;
a second edge detection circuit for detecting a second comparison target signal in timing synchronous with the clock signal;
a state output circuit for outputting a signal corresponding to a phase difference between the first and second comparison target signals to a control terminal of a tri-state circuit, based on a detection signal of the first and second edge detection circuits; and
a status management circuit for outputting a signal corresponding to a phase advance or delay of the first and second comparison target signals to an input terminal of the tri-state circuit, wherein
when there is no phase difference between the first and second comparison target signals, said state output circuit outputs a signal for enabling the tri-state circuit to take high impedance to the control terminal of the tri-state circuit, and when there is a phase difference between the comparison target signals, said state output circuit outputs a signal for enabling current to flow for a period corresponding to a phase difference to the control terminal of the tri-state circuit, and also outputs a signal corresponding to a phase advance or delay of the first and second comparison target signals to the status management circuit.

22. A semiconductor device on whose semiconductor integrated circuit substrate is formed a phase comparator, said phase comparator, comprising:
a first edge detection circuit for detecting a first comparison target signal in timing synchronous with a clock signal;
a second edge detection circuit for detecting a second comparison target signal in timing synchronous with the clock signal;
a state output circuit for outputting a signal corresponding to a phase difference between the first and second comparison target signals to a control terminal of a tri-state circuit, based on a detection signal of the first and second edge detection circuits; and
a status management circuit for outputting a signal corresponding to a phase advance or delay of the first and second comparison target signals to an input terminal of the tri-state circuit, wherein
said first or second edge detection circuit comprises a first holding circuit for holding the first comparison target signal in timing synchronous with the clock signal, a second holding circuit for holding the second comparison target signal in timing synchronous with the clock signal and an AND circuit for carrying out logical AND between the output signal of the first holding circuit and an inverted output signal of the second holding circuit.

23. The semiconductor device according to claim 19, wherein
said status management circuit outputs a signal indicating a phase advance or delay of the first and second target signals to an input terminal of the tri-state circuit, based on a state signal outputted from the state output circuit.

24. A semiconductor device having a phase comparator, said phase comparator, comprising:
- a first edge detection circuit for detecting a first comparison target signal in timing synchronous with a clock signal;
- a second edge detection circuit for detecting a second comparison target signal in timing synchronous with the clock signal;
- a state output circuit for generating a signal corresponding to a phase difference based on a detection signal of the first edge detection circuit and a detection signal of the second edge detection circuit and outputting a state signal indicating a phase advance or delay of the first and second comparison target signals;
- a phase difference signal generation circuit for outputting a signal corresponding to the phase difference to a control terminal of a tri-state circuit, based on the signal of the state output circuit; and
- a status management circuit for outputting a signal corresponding to a phase advance or delay of the first and second comparison target signals to an input terminal of the tri-state circuit,
- wherein the status management circuit outputs a first-state signal either at a high level or at a low level to an input terminal of a tri-state buffer in timing synchronous with the start-up of the first comparison target signal when the phase of the first comparison target signal is ahead of the phase of the second comparison target signal, when the second comparison target signal changes, the status management circuit continues to output the first-state signal whose state is the same as before the second comparison target signal changes.

25. The semiconductor device according to claim 24, wherein
- when there is no phase difference between the first and second comparison target signals, said state output circuit outputs a signal for enabling the output of the tri-state circuit to take high impedance to the control input of the tri-state circuit, and when there is a phase difference between the first and second comparison target signals, it outputs a signal for enabling current to flow through the tri-state circuit to a control terminal of the tri-state buffer.

* * * * *